(12) United States Patent
Yoshikawa (10) Patent No.: US 7,949,023 B2
(45) Date of Patent: May 24, 2011

(54) SEMICONDUCTOR LASER APPARATUS (75) Inventor: Noriyuki Yoshikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/613,928

(22) Filed: Nov. 6, 2009

(65) Prior Publication Data
US 2010/0158059 A1    Jun. 24, 2010

(30) Foreign Application Priority Data

Dec. 18, 2008  (JP) ................................ 2008-321688
Aug. 11, 2009  (JP) ................................ 2009-186183

(51) Int. Cl.
*H01S 3/00* (2006.01)
*H01S 3/04* (2006.01)

(52) U.S. Cl. .......................................... 372/36; 372/33
(58) Field of Classification Search .................. 372/33, 372/36, 87
See application file for complete search history.

(56) References Cited

U.S. PATENT DOCUMENTS

| 6,985,505 | B2 | 1/2006 | Nomoto et al. | |
| 7,443,901 | B2 * | 10/2008 | Inoue et al. | 372/87 |
| 2006/0274802 | A1 * | 12/2006 | Aoki et al. | 372/45.01 |
| 2008/0084903 | A1 | 4/2008 | Kunimasa | |
| 2009/0041076 | A1 | 2/2009 | Inoue et al. | |
| 2009/0129420 | A1 * | 5/2009 | Regaard et al. | 372/50.12 |

FOREIGN PATENT DOCUMENTS

| JP | 2006-108262 | 4/2006 |
| JP | 2008-91768 | 4/2008 |

* cited by examiner

*Primary Examiner* — Armando Rodriguez
(74) *Attorney, Agent, or Firm* — Hamre, Schumann, Mueller & Larson, P.C.

(57) ABSTRACT

A semiconductor laser apparatus of the present invention includes: a semiconductor laser chip 1 having an electrode 11 formed on a surface of the semiconductor laser chip 1; a heat sink 3 for the semiconductor laser chip 1; a submount 2 disposed between the semiconductor laser chip 1 and the heat sink 3 and bonded to the semiconductor laser chip 1 and the heat sink 3; and recessed marks 13 formed on the surface of the semiconductor laser chip 1 by partially removing the electrode 11, wherein the semiconductor laser chip 1 is longer in the resonator direction than in a direction orthogonal to the resonator direction, and the recessed marks 13 are disposed within a predetermined distance from each of the front and rear end faces of the semiconductor laser chip.

19 Claims, 8 Drawing Sheets

PRIOR ART

SEMICONDUCTOR LASER APPARATUS

FIELD OF THE INVENTION

The present invention relates to a semiconductor laser apparatus used for writing, erasing, and reading information on an optical disk.

BACKGROUND OF THE INVENTION

In recent years, higher power laser beams have been demanded of semiconductor laser apparatuses used as light sources in optical disk drives to write, erase, and read information on optical disks. This is because high power laser beams can improve writing speeds on optical disks. For this reason, in a semiconductor laser chip, an optical gain region has been expanded by increasing a length (laser cavity length) in an outgoing direction and a radiating area has been also expanded, so that a high optical output has been stably obtained. However, as the laser cavity length of the semiconductor laser chip increases, a stress caused by assembling or the structure is applied in a direction that pulls the semiconductor laser chip.

Figure 11:
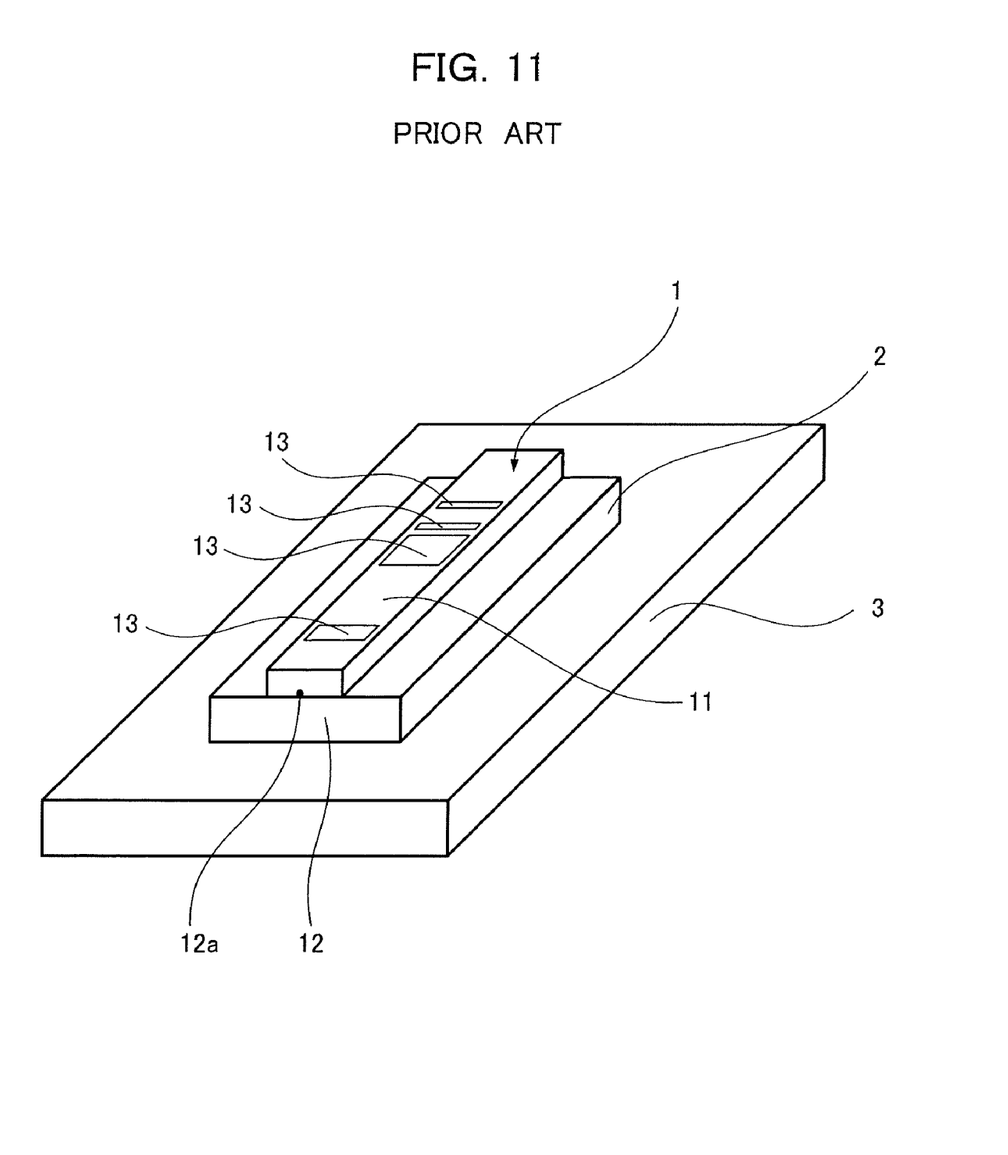
FIG. 11 is a perspective view schematically showing the configuration of the semiconductor laser apparatus according to the prior art.

FIG. 11 shows a semiconductor laser apparatus of the prior art. A semiconductor laser chip 1 is joined to a heat sink 3 via a submount 2. The heat sink 3 is used for preventing emission efficiency from decreasing due to a temperature increase on the semiconductor laser chip 1 during a laser operation and preventing breakage and the like of the semiconductor laser chip 1. Reference numerals 11, 12, and 12a in FIG. 11 respectively denote an electrode, an end face, and an emission region on a surface of the semiconductor laser chip 1.

When the semiconductor laser apparatus configured thus is exposed to a high temperature during joining and then is cooled to room temperature, a stress is generated by a difference in thermal expansion coefficient between the submount 2 and the heat sink 3 and a tensile stress is generated on the surface of the semiconductor laser chip 1. When the surface of the semiconductor laser chip 1 has recessed portions including marks 13, stresses are concentrated on the steps of the recessed portions, so that cracks may occur on the semiconductor laser chip 1, starting from portions where stresses are concentrated. This tendency is currently noticeable because long and thin semiconductor laser chips 1 have been used in response to increased laser cavity lengths.

As a method for reducing the stress of a semiconductor laser chip, for example, Japanese Patent Laid-Open No. 2006-108262 discloses a substantially square die bonding surface formed on a semiconductor laser chip which is equal in length in the resonator direction and the width direction. However, this method increases the area of the semiconductor laser chip and the manufacturing cost.

Further, Japanese Patent Laid-Open No. 2008-91768 discloses a limited junction region. However, this method interferes with heat radiation and thus reduces thermal reliability particularly in a high-power semiconductor laser chip.

DISCLOSURE OF THE INVENTION

The present invention has been devised in view of the foregoing problems. An object of the present invention is to provide a semiconductor laser apparatus which can suppress the occurrence of a stress caused by a structure in a semiconductor laser chip having a long laser cavity length without increasing the area of the semiconductor laser chip or interfering with heat radiation, so that a crack and a fracture can be suppressed on the semiconductor laser chip.

In order to attain the object, a semiconductor laser apparatus of the present invention includes: a semiconductor laser chip having an electrode formed on a surface of the semiconductor laser chip; a heat sink for the semiconductor laser chip; a submount disposed between the semiconductor laser chip and the heat sink and bonded to the semiconductor laser chip and the heat sink; and recessed marks formed on the surface of the semiconductor laser chip by partially removing the electrode, wherein the semiconductor laser chip is longer in a resonator direction than in a direction orthogonal to the resonator direction, and the recessed marks are disposed within a predetermined distance from each of the front and rear end faces of the semiconductor laser chip.

In the long and thin semiconductor laser chip, the recessed marks are limited to the surface of the electrode within the predetermined distance from each of the front and rear end faces of the resonator direction, so that further stress concentration can be avoided at the center of the resonator direction where a stress has been concentrated. Thus it is possible to suppress a crack and a fracture which are caused by a temperature change and a mechanical stress on the semiconductor laser chip.

The recessed marks are formed in a region within a distance of (a+b)×2 from each of the front and rear end faces of the semiconductor laser chip where a is the thickness of the semiconductor laser chip and b is the thickness of the submount. The recessed portions causing stress concentration are limited to regions close to the front and rear end faces of the resonator direction.

The recessed marks are as large as or smaller than a quarter of a length of the semiconductor laser chip in the direction orthogonal to the resonator direction and the recessed marks are made up of round shapes. The recessed portions causing stress concentration are limited to small sizes and round shapes.

It is particularly preferable when the semiconductor laser chip has a length of at least 1.3 mm in the resonator direction. The submount desirably has the same thermal expansion coefficient as the semiconductor laser chip. The semiconductor laser chip may be made up of a semiconductor substrate composed of gallium arsenide, the submount may be composed of aluminum nitride, and the heat sink may be composed of copper.

DESCRIPTION OF THE EMBODIMENT(S)

An embodiment of the present invention will be described below with reference to the accompanying drawings.

Figure 1:
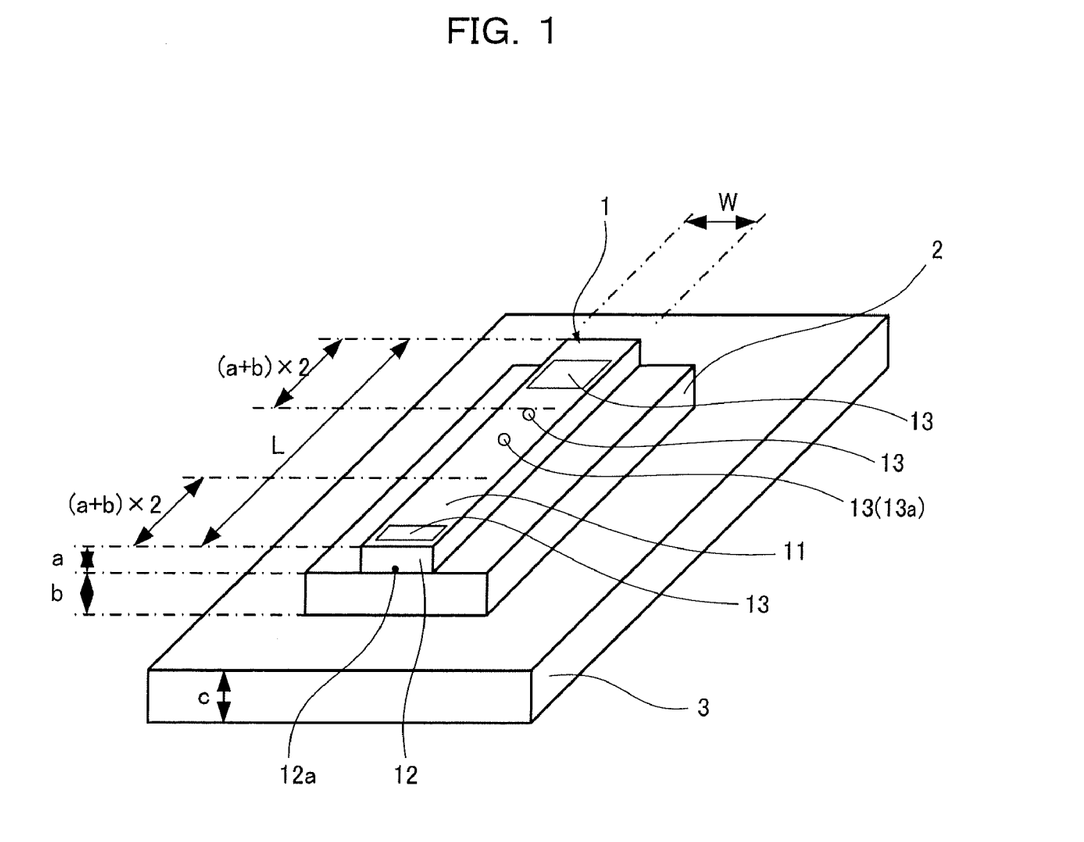
FIG. 1 is a perspective view schematically showing the configuration of a semiconductor laser apparatus according to an embodiment of the present invention.
Figure 2:
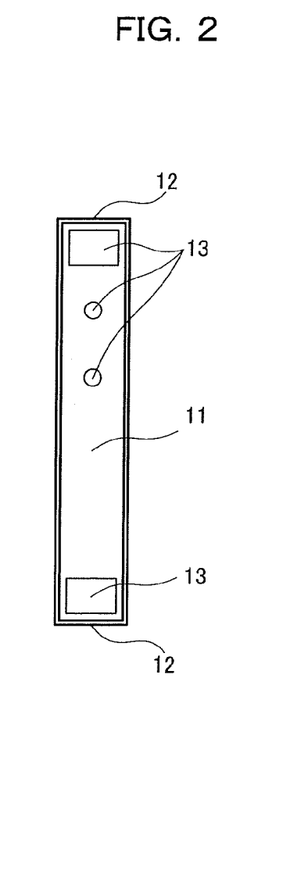
FIG. 2 is a plan view showing a semiconductor laser chip constituting the semiconductor laser apparatus of FIG. 1.
Figure 3:
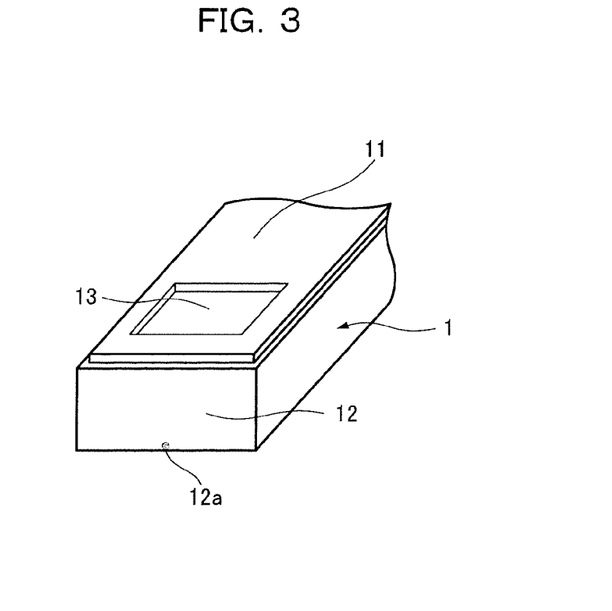
FIG. 3 is a partially enlarged view of the semiconductor laser chip shown in FIG. 2.

As shown in FIGS. 1 to 3, a semiconductor laser apparatus includes a semiconductor laser chip 1 for passing current in the thickness direction and a heat sink 3 on which the semiconductor laser chip 1 is bonded via a submount 2. The semiconductor laser chip 1 has electrodes 11 formed on both surfaces (the electrode on the undersurface is not shown) and has an emission region 12a on one end face 12. A length L in the resonator direction is larger than a length W in a direction orthogonal to the resonator direction. On the top surface of the semiconductor laser chip 1, recessed marks 13 for recognition and positioning are disposed within a predetermined distance from each of the front and rear end faces of the resonator direction.

The semiconductor laser chip 1 is made up of a semiconductor substrate mainly composed of gallium arsenide. The submount 2 is a substrate mainly composed of aluminum nitride which is a material having the same thermal expansion coefficient as the semiconductor laser chip 1 with high thermal conductivity. The submount 2 is as long as the semiconductor laser chip 1 and has a larger width than the semiconductor laser chip 1. The heat sink 3 is mainly composed of a metal such as copper which is a material having high thermal conductivity.

In the manufacturing of the semiconductor laser apparatus, the semiconductor laser chip 1 is attached to one surface of the submount 2 with heat by using solder such as AuSn solder. Further, the submount 2 is joined with heat to a package member such as a lead frame acting as the heat sink 3, by using a thermosetting adhesive such as silver paste. After that, wire bonding (not shown) is performed with gold wires and the like.

As has been discussed, since laser cavity lengths have been increased, the semiconductor laser chip 1 is extremely long and thin as shown in FIG. 1. The semiconductor laser chip 1 and the submount 2 are made of, as has been discussed, the materials having only a small difference in thermal expansion coefficient, so that even in a joining step using heat, a stress hardly occurs due to the difference in thermal expansion coefficient. On the other hand, the heat sink 3 and the submount 2 have a large difference in thermal expansion coefficient, so that when the heat sink 3 and the submount 2 return to room temperature after the completion of a curing step (silver paste has a curing temperature of about 150° C.) of an adhesive for bonding the heat sink 3 and the submount 2, a stress is generated due to the difference in thermal expansion coefficient. On the top surface of the semiconductor laser chip 1, a tensile stress is generated and causes a crack or a fracture particularly on the long and thin semiconductor laser chip 1. This phenomenon will be described below.

Figure 4:
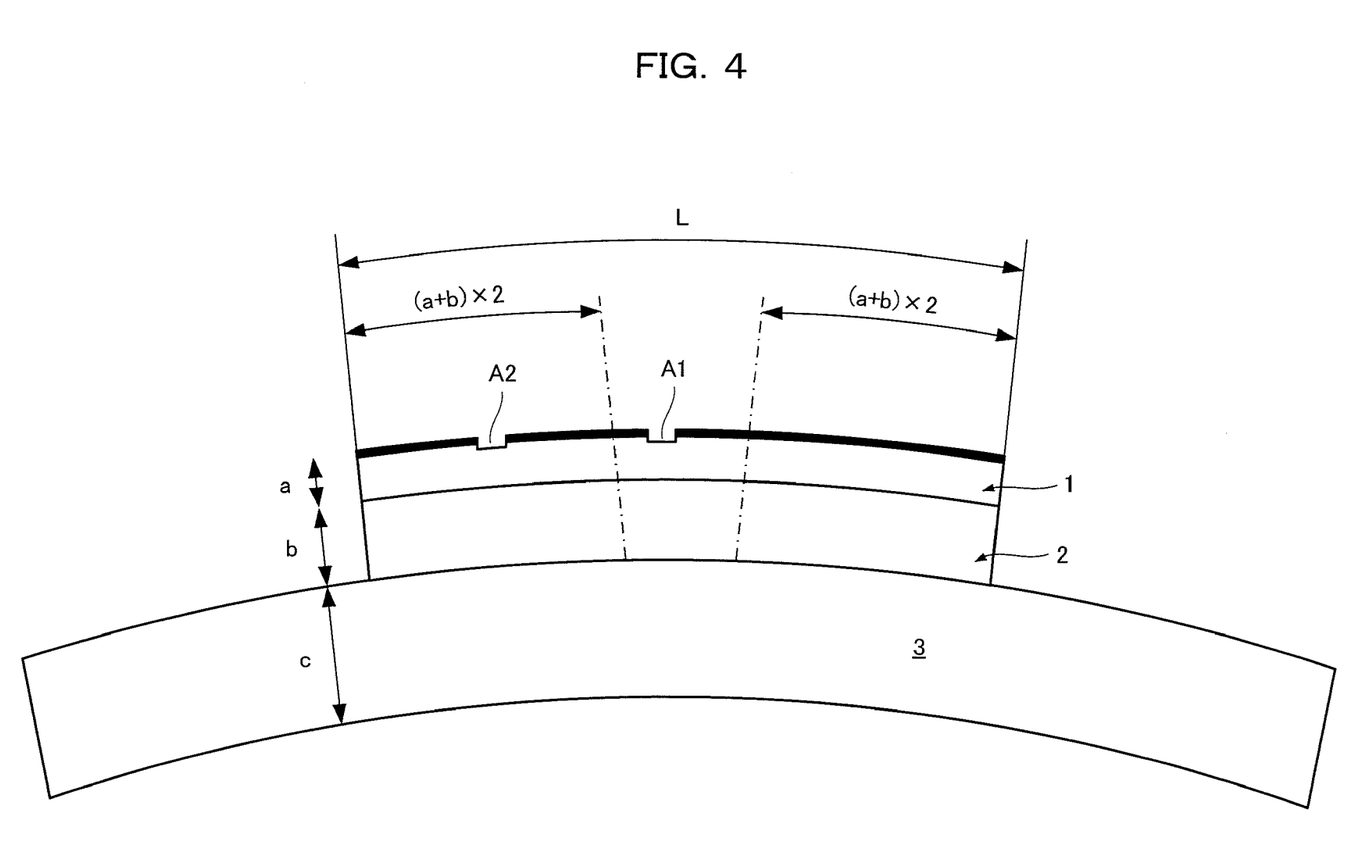
FIG. 4 is a conceptual diagram of the semiconductor laser apparatus shown in FIG. 1.

As shown in FIG. 4, when the heat sink 3 and the submount 2 return to room temperature after the submount 2 is joined onto the heat sink 3, the heat sink 3 contracts more than the submount 2 due to the difference in thermal expansion coefficient. Thus a stress is generated and curling occurs so as to protrude to the submount. On the heat sink 3, a stress is not generated in a region outside a region where the submount 2 is joined. On the top surface of the semiconductor laser chip 1 connected on the heat sink 3 via the submount 2, a tensile stress remains.

For example, in order to improve heat radiation, a lead frame used as the heat sink 3 generally has a thickness of about 400 μm which is larger than the thicknesses of the submount 2 and the semiconductor laser chip 1, and the lead frame has a large area. Thus a stress of contraction is generated on the heat sink 3 when the heat sink 3 and the submount 2 return to room temperature after being joined, and a tensile (stretching) stress is generated on the semiconductor laser chip 1 mounted on the heat sink 3 via the submount 2.

The stress tends to increase as the laser cavity length of the semiconductor laser chip 1 increases. Further, the stress strongly acts on the top surface of the semiconductor laser chip 1 as a tensile stress. The stress increases as being close to the center in the resonator direction. The end faces are free from a stress and thus a stress around the end faces is small. This is because both ends of the semiconductor laser chip 1 are not exposed to a tensile stress from the outside.

As shown in FIG. 4, when the top surface of the semiconductor laser chip 1 has recessed portions and the like, stresses are further concentrated. Generally, on the top surface of the semiconductor laser chip 1, the marks 13 required for assembling or process control are made as recessed portions. The recessed marks 13 further concentrate stresses and cracks may occur from the portions of the marks 13 in the worst case.

Figure 5:
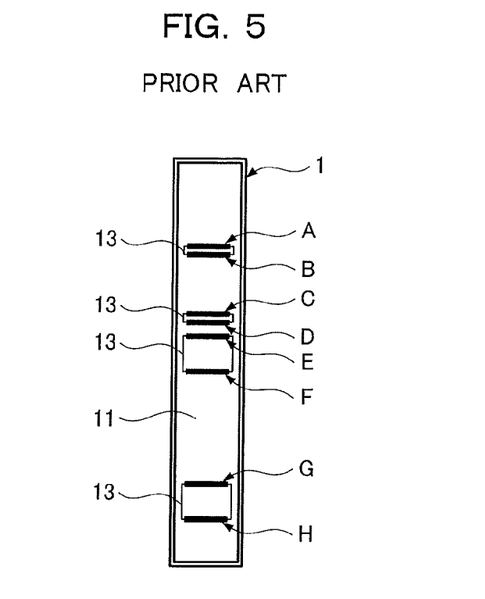
FIG. 5 shows a simulation result of a stress generated near a surface of a semiconductor laser chip constituting a semiconductor laser apparatus according to the prior art.
Figure 6:
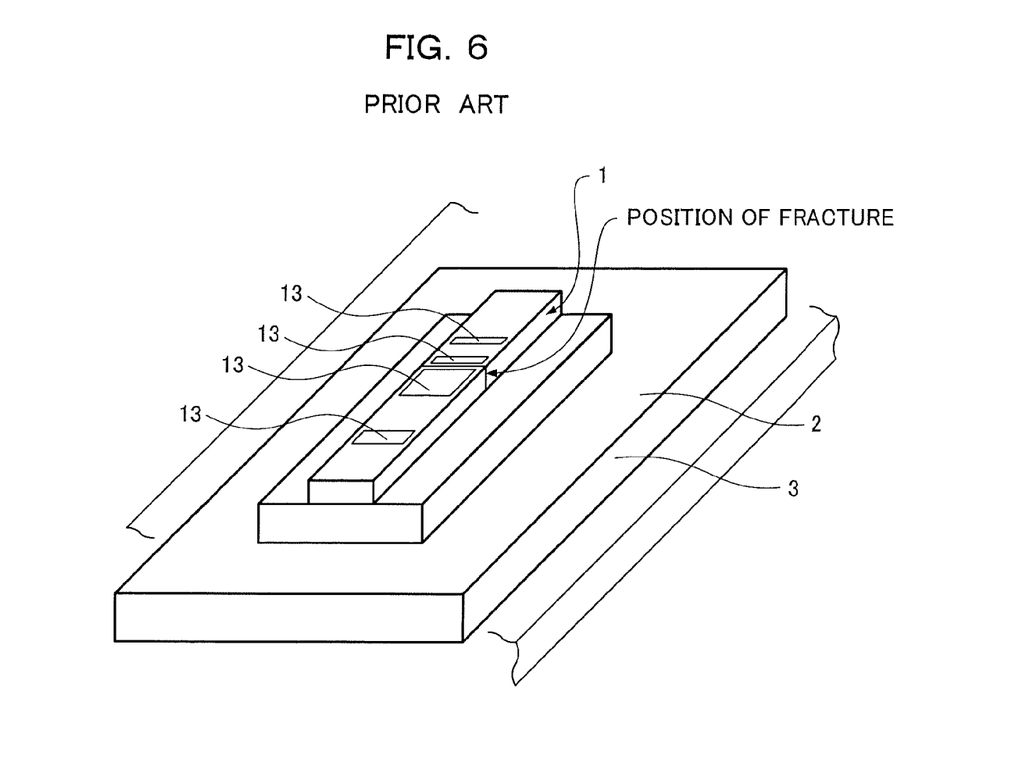
FIG. 6 is a perspective view of a position where a fracture is generated on the semiconductor laser chip shown in FIG. 5.

This phenomenon was confirmed by a structure simulation. In a simulation of an in-plane distribution of stresses in the semiconductor laser chip 1, steps A to H in FIG. 5 had larger stresses than the adjacent regions. Particularly, the closer to the center, the larger the stress. A fracture actually occurred in a region along the steps C, D, E, and F of the central marks as shown in, for example, FIG. 6 and no fractures occurred on the other steps. Simulation conditions at that time were a laser cavity length of 2000 μm, a chip width of 250 μm, a chip thickness of 100 μm, a submount thickness of 250 μm, and a heat sink thickness of 400 μm. A stress applied to the recessed portion was increased by about 15 MPa as compared with a stress applied to a flat portion around the recessed portion. Further, it was confirmed that the recessed portion sufficiently acted as a base point of fracture. Even when the recessed portion has a small depth of about 0.2 μm, a stress is concentrated near the step.

As has been discussed, curling resulting in a stress is caused by the joint of the heat sink 3 and the submount 2 which have large structures. It is considered that the submount 2 receives, on the junction interface, a contraction stress from the heat sink 3, so that the front side of the submount is curled in a protruding manner. The surface of the semiconductor laser chip 1 on the opposite side from the junction interface is similarly curled in a protruding manner like the submount 2 curled in a protruding manner, so that the surface receives a tensile stress. The tensile stress is generated by a lateral pull of the structure and the stress inevitably decreases around the left end face having no structures on the left and the right end face having no structures on the right. The farther away from the end face, the stress increases. It is considered that the stress is maximized and the probability of a fracture and the like increases around the center of the semiconductor laser chip 1.

Figure 7:
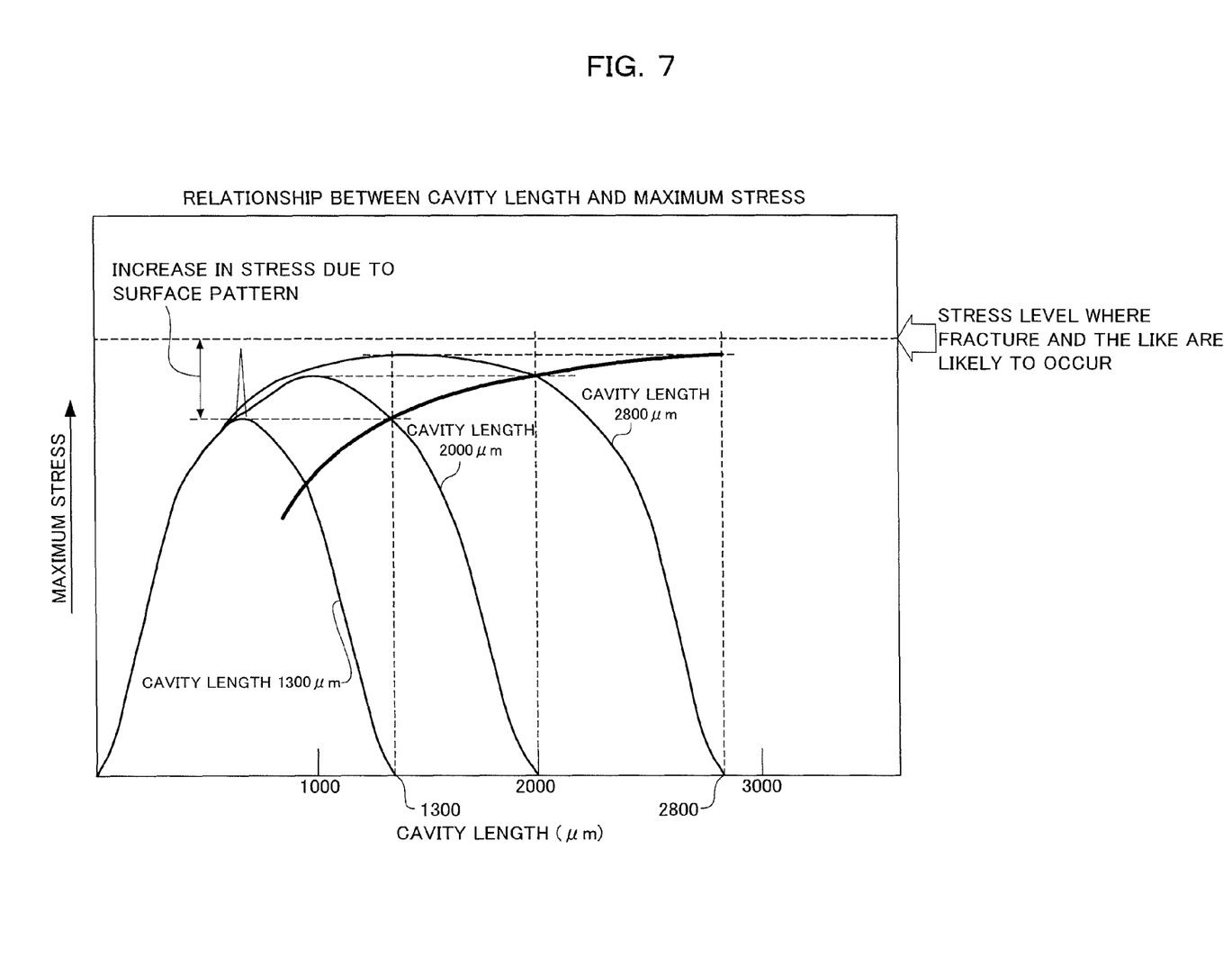
FIG. 7 shows the relationship between the laser cavity lengths and the maximum stresses of the semiconductor laser chip of the present invention and the semiconductor laser chip of the prior art.

According to a further study by the inventor, no fractures occur when the semiconductor laser chip 1 is made of GaAs with a laser cavity length of less than 1300 μm. As shown in FIG. 7, the longer the laser cavity length, the larger the stress around the center. In the case of a laser cavity length of less than 1300 μm, even when a stress is increased (indicated by a thin line) by the pattern of the surface, a stress generated on the semiconductor laser chip is not so large as to increase the probability of a fracture and the like.

When the semiconductor laser chip 1 has a laser cavity length of 1300 μm or more, the peak value of a stress caused by the step of the recessed portion can be suppressed to the breaking stress of the semiconductor laser chip 1 or less in a range expressed by a distance of about (a+b)×2 from the end face where a is the thickness of the semiconductor laser chip 1 and b is the thickness of the submount. The simulation proves that the stress is hardly affected by the dependence of the recessed portion on a depth and a thickness c of the heat sink 3. The position of the recessed portion is set within the range as a guide of design.

Figure 8:
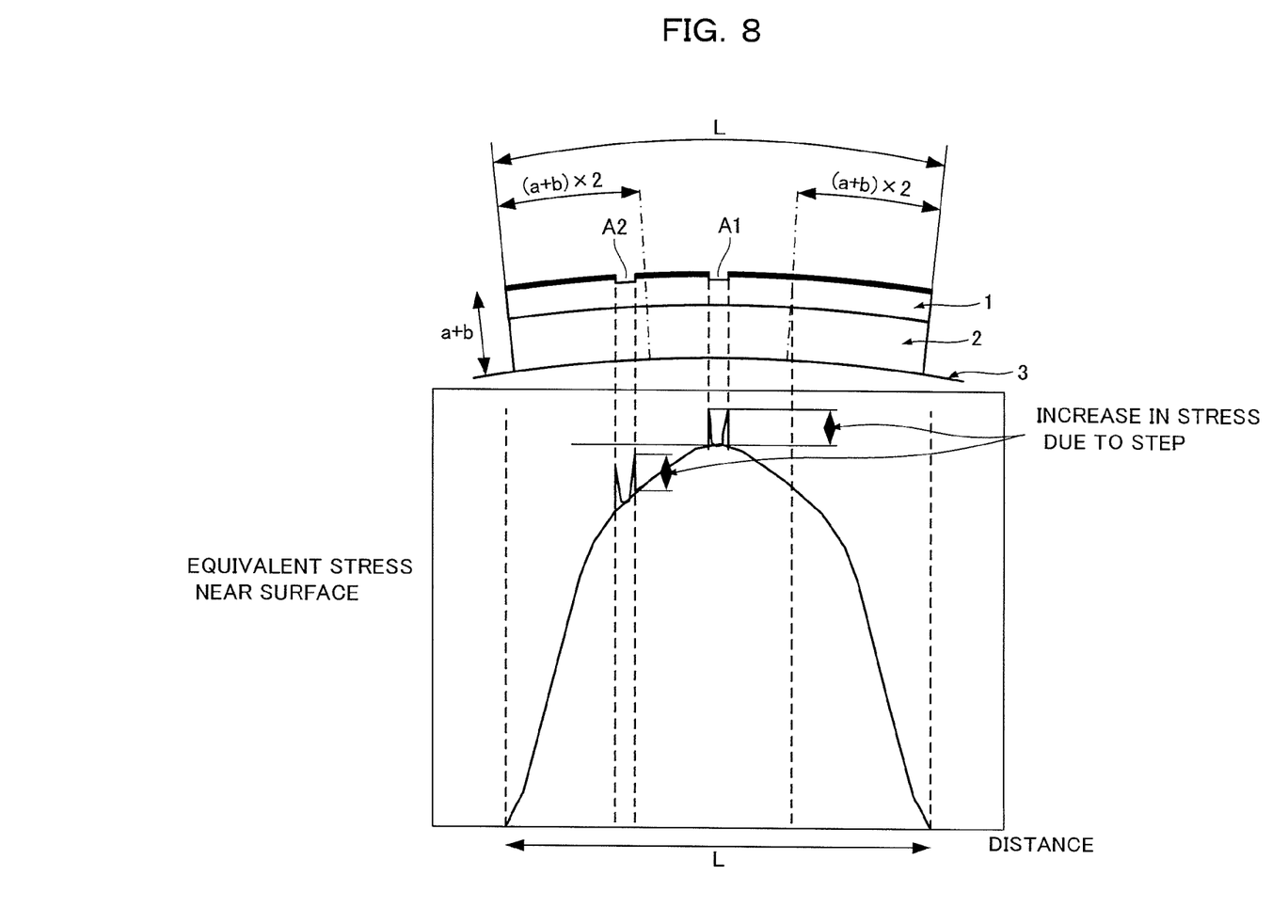
FIG. 8 shows a simulation result of a stress generated near a surface of the semiconductor laser chip of the semiconductor laser apparatus shown in FIG. 4.

FIG. 8 shows a simulation result. In FIG. 8, a stress generated on the surface of the semiconductor laser chip 1 is plotted along the resonator direction. Stresses near the steps are compared between a recessed portion A1 around the center of the laser cavity length and a recessed portion A2 disposed within the range of a distance (a+b)×2 from the end face. The comparison proves that the stress generated on the recessed portion A2 disposed in the range of (a+b)×2 is smaller, even at the peak value, than the stress of a flat portion around the center of the laser cavity length.

According to the simulation result, the recessed marks are not provided at the center of the laser cavity length where a stress is concentrated but the recessed marks are disposed in the range of (a+b)×2 from the end face of the element, so that damage such as a crack and a fracture can be suppressed on the element.

In some cases, however, it is necessary to provide the recessed marks around the center of the semiconductor laser chip 1 to use the marks for position recognition in the assembling of the apparatus. In such a case, the marks are reduced in size and are not shaped with linear portions in a direction orthogonal to the resonator direction or a direction substantially orthogonal to the resonator direction, that is, in a direction along which a fracture is likely to occur, thereby avoiding damage such as a crack and a fracture on the element.

For example, even when the recessed marks are disposed in an inner region beyond 600 μm from the end faces on the surface of the semiconductor laser chip 1 having a laser cavity length of at least 1300 μm, damage such as a crack and a fracture on the element can be avoided by forming the marks which are as large as or smaller than a quarter of the length W in the width direction of the semiconductor laser chip 1 and are made up of round shapes such as a circle without linear components in a direction orthogonal to an exit optical axis.

Figure 9:
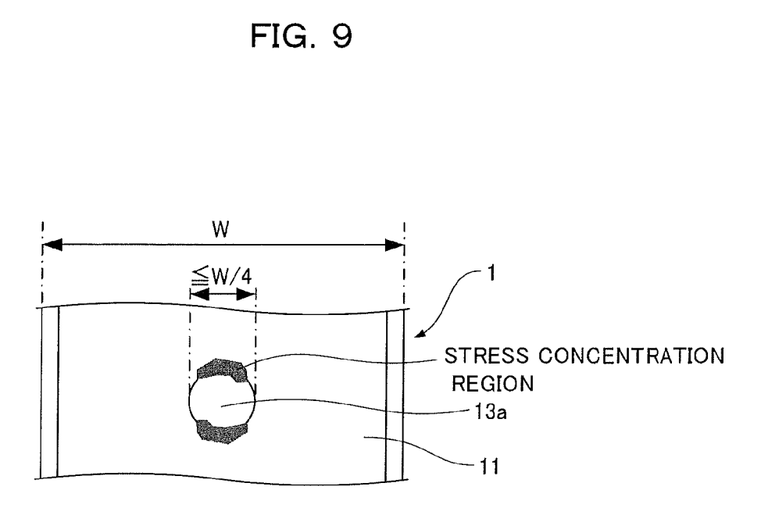
FIG. 9 shows the stress concentration region of a recessed mark at the center of the semiconductor laser chip shown in FIG. 2.
Figure 10:
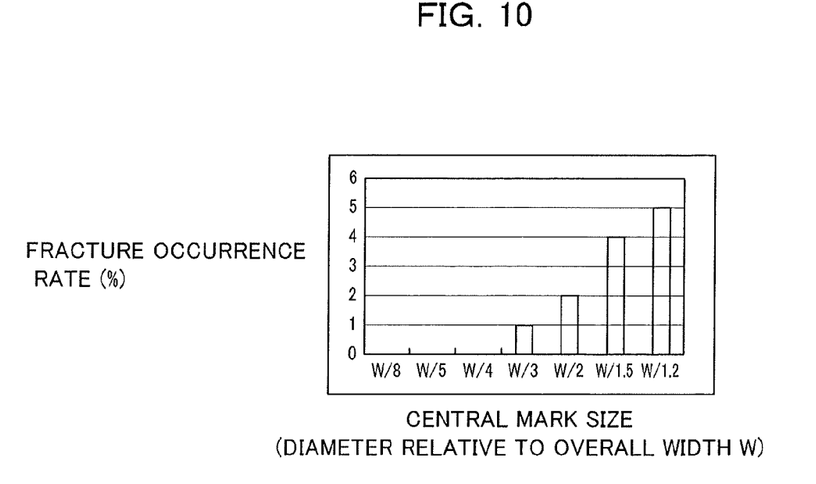
FIG. 10 shows the relationship between the occurrence rate of fractures and the size of the recessed mark at the center of the semiconductor laser chip shown in FIG. 2.

FIG. 9 shows a test result. Even in the case of a mark 13a formed at the center of the semiconductor laser chip 1, the mark 13a is circular as shown in FIG. 9 and is as large as or smaller than a quarter of W, so that the mark 13a hardly causes a fracture over the width even when a stress is concentrated on the portion. As shown in FIG. 10, the occurrence rate of fractures is zero or substantially zero with a laser cavity length of 2 mm and a temperature cycle of −60° C. to 150° C.

As has been discussed, the recessed marks provided on the semiconductor laser chip are formed with predetermined region, shape, and size, so that further stress concentration can be avoided at the center of the resonator direction where a stress has been concentrated. It is possible to improve resistance against a temperature change and a mechanical stress and resistance against a crack and a fracture on the element.

Thus it is possible to achieve the semiconductor laser apparatus which has a long laser cavity length and can respond to a high power with the semiconductor laser chip. Since the semiconductor laser chip does not have to have a large width, it is possible to eliminate the necessity for a large area, thereby suppressing the manufacturing cost of the semiconductor laser chip. Further, the heat radiation of the semiconductor laser chip is not interfered.

What is claimed is:

1. A semiconductor laser apparatus comprising:
a semiconductor laser chip having an electrode formed on a top surface of the semiconductor laser chip;
a heat sink for the semiconductor laser chip;
a submount disposed between the semiconductor laser chip and the heat sink and bonded to the semiconductor laser chip and the heat sink; and
recessed marks including first recessed marks formed on the electrode,
wherein the semiconductor laser chip is longer in a resonator direction than in a direction orthogonal to the resonator direction, and the first recessed marks are disposed in a region within a distance of (a+b)×2 from each of front and rear end faces of the semiconductor laser chip, where a is a thickness of the semiconductor laser chip and b is a thickness of the submount.

2. The semiconductor laser apparatus according to claim 1, wherein at least one of the first recessed marks is round.

3. The semiconductor laser apparatus according to claim 1, wherein the semiconductor laser chip has a length of at least 1.3 mm in the resonator direction.

4. The semiconductor laser apparatus according to claim 1, wherein the submount has a same thermal expansion coefficient as the semiconductor laser chip.

5. The semiconductor laser apparatus according to claim 1, wherein the semiconductor laser chip is made up of a semiconductor substrate composed of gallium arsenide, the submount is composed of aluminum nitride, and the heat sink is composed of copper.

6. The semiconductor laser apparatus according to claim 1, wherein the first recessed marks are no larger than a quarter of the length of the semiconductor laser chip in a direction orthogonal to the resonator direction.

7. The semiconductor laser apparatus according to claim 1, wherein at least one of the first recessed marks has a rectangular shape.

8. The semiconductor laser apparatus according to claim 1, wherein the semiconductor laser chip is exposed in the recessed marks.

9. The semiconductor laser apparatus according to claim 1, wherein the recessed marks further include at least one second recessed mark formed on the electrode, the second recessed mark is disposed other than in the region within the distance of (a+b)×2 from each of the front and rear end faces of the semiconductor laser chip where a first recessed portion disposed in, and the second recessed mark is no larger than a quarter of the length of the semiconductor laser chip in a direction orthogonal to the resonator direction.

10. The semiconductor laser apparatus according to claim 9, wherein the second recessed mark is round.

11. A semiconductor laser apparatus comprising:
a semiconductor laser chip having an electrode formed on a top surface of the semiconductor laser chip;
a heat sink for the semiconductor laser chip;
a submount disposed between the semiconductor laser chip and the heat sink and bonded to the semiconductor laser chip and the heat sink; and recessed marks including first recessed marks formed on the electrode, wherein the semiconductor laser chip is longer in a resonator direction than in a direction orthogonal to the resonator direction, and the first recessed marks are disposed in a region within a distance of (a+b)×2 from at least one of front and rear end faces of the semiconductor laser chip, where a is a thickness of the semiconductor laser chip and b is a thickness of the submount.

12. The semiconductor laser apparatus according to claim 11, wherein at least one of the first recessed marks is round.

13. The semiconductor laser apparatus according to claim 11, wherein the first recessed marks are no larger than a quarter of the length of the semiconductor laser chip in a direction orthogonal to the resonator direction.

14. The semiconductor laser apparatus according to claim 11, wherein at least one of the first recessed marks is rectangular shape.

15. The semiconductor laser apparatus according to claim 12, wherein the recessed marks further include at least one second recessed mark formed on the electrode, the second recessed mark is disposed other than in the region within the distance of (a+b)×2 from each of the front and rear end faces of the semiconductor laser chip where a first recessed portion disposed in, and the second recessed mark is no larger than a quarter of the length of the semiconductor laser chip in a direction orthogonal to the resonator direction.

16. The semiconductor laser apparatus according to claim 15, wherein the second recessed mark is round.

17. The semiconductor laser apparatus according to claim 11, wherein the semiconductor laser chip has a length of at least 1.3 mm in the resonator direction.

18. The semiconductor laser apparatus according to claim 11, wherein the submount has the same thermal expansion coefficient as the semiconductor laser chip.

19. The semiconductor laser apparatus according to claim 11, wherein the semiconductor laser chip is made up of a semiconductor substrate composed of gallium arsenide, the submount is composed of aluminum nitride, and the heat sink is composed of copper.

* * * * *